(12) United States Patent
Aufiero

(10) Patent No.: US 6,231,279 B1
(45) Date of Patent: May 15, 2001

(54) DRILLING MACHINE WITH AT LEAST TWO MACHINING HEADS FOR MACHINING PRINTED CIRCUIT BOARDS

(75) Inventor: Giacomo Aufiero, Castellamonte (IT)

(73) Assignee: Pluritec Italia S.p.A., Borgomanero (IT)

( * ) Notice: Subject to any disclaimer, the term of this patent is extended or adjusted under 35 U.S.C. 154(b) by 0 days.

(21) Appl. No.: 09/318,962

(22) Filed: May 26, 1999

(30) Foreign Application Priority Data

May 29, 1998 (IT) ................................. T098A0464

(51) Int. Cl.[7] ................................. B23B 39/24
(52) U.S. Cl. ................. 408/3; 408/42; 408/43; 408/46
(58) Field of Search ................. 408/1 R, 3, 42, 408/46, 43

(56) References Cited

U.S. PATENT DOCUMENTS

| 5,075,530 | * 12/1991 | Lee | 408/42 |
| 5,230,685 | 7/1993 | Christen et al. | 483/55 |
| 5,265,986 | * 11/1993 | Prokopp | 408/3 |
| 5,584,788 | * 12/1996 | Piovano | 408/43 |
| 5,882,286 | * 3/1999 | Aufiero | 408/46 |
| 6,099,449 | * 8/2000 | Geiger | 408/46 |

FOREIGN PATENT DOCUMENTS

| 0652693 A1 | 5/1995 | (EP) . |
| 0891126 | 1/1999 | (EP) . |

* cited by examiner

Primary Examiner—Steve C. Bishop
(74) Attorney, Agent, or Firm—Sheridan Ross P.C.

(57) ABSTRACT

The drilling machine has a cross member along which slide two carriages supporting two machining heads; the two carriages are moved independently of each other along the X axis; one of the two machining heads is fitted to the respective carriage by means of a slide which is also moved along the Y axis by an electric motor controlled by a numeric-control unit; the maximum travel of the slide is at least twice the pitch of the rows in the matrix of holes in the printed circuit boards; and the movement of the slide provides for both setting the two machining heads along the Y axis, and enabling the two machining heads to simultaneously drill two adjacent rows in the matrix of holes.

8 Claims, 2 Drawing Sheets

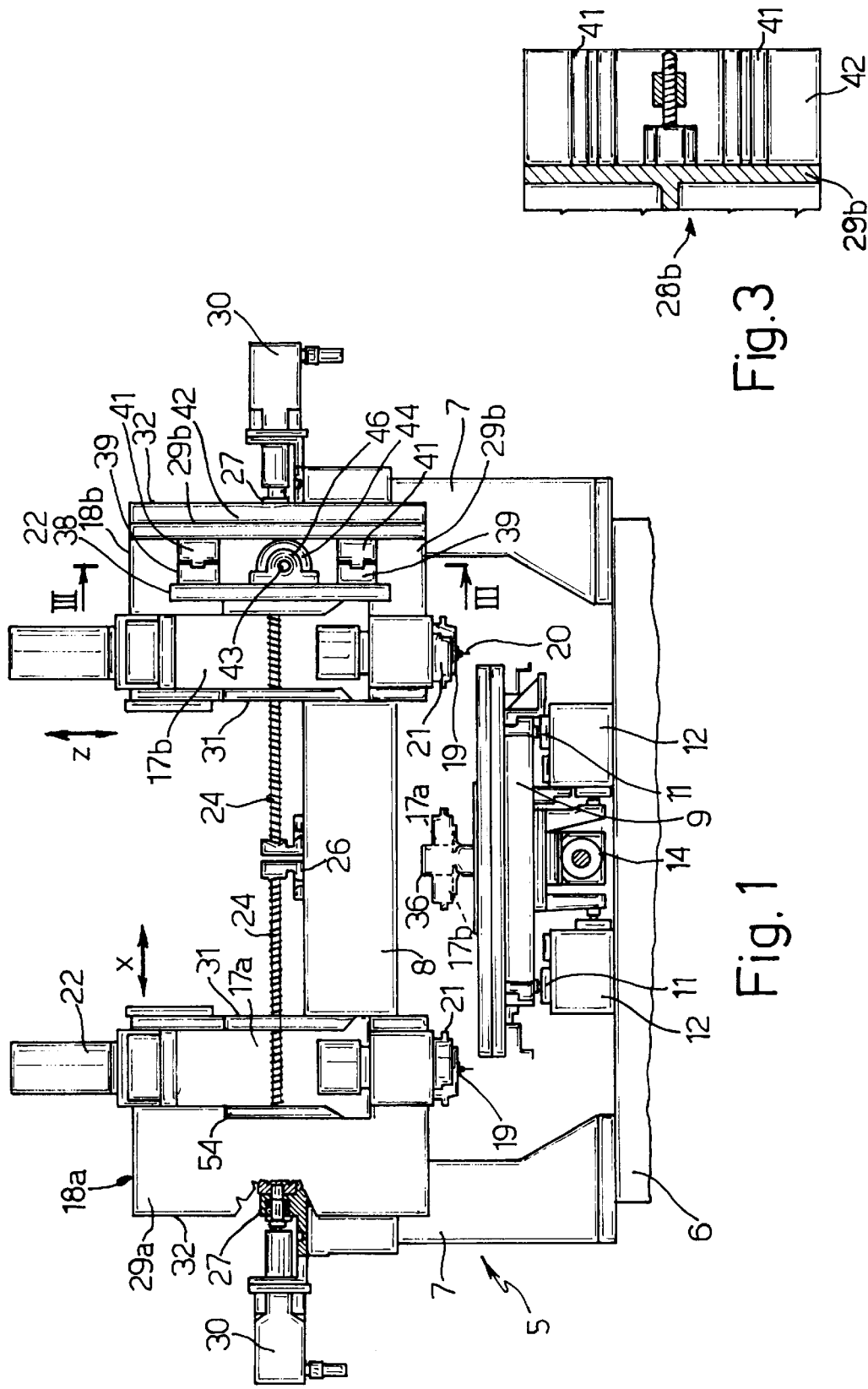

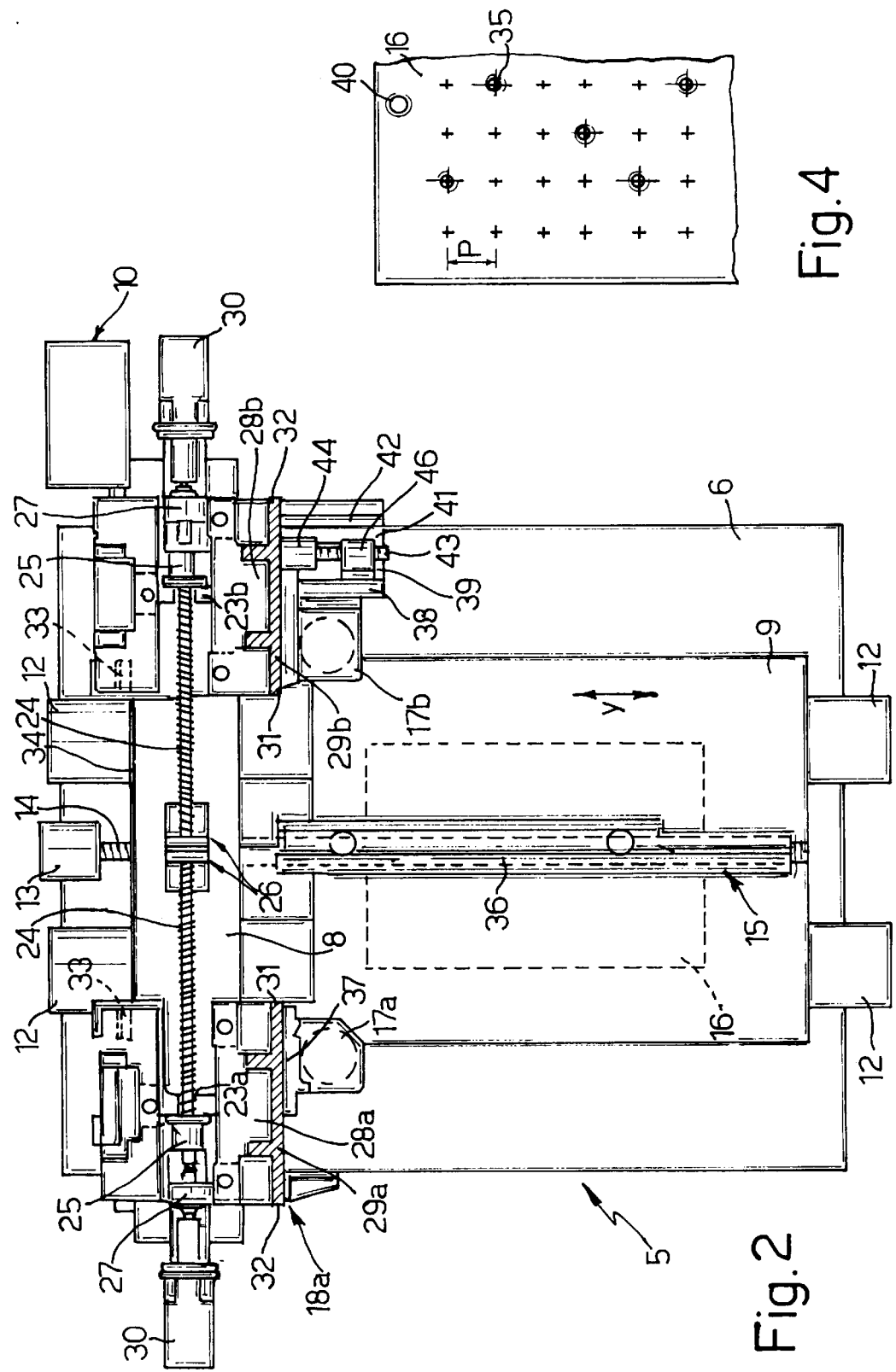

DRILLING MACHINE WITH AT LEAST TWO MACHINING HEADS FOR MACHINING PRINTED CIRCUIT BOARDS

The present invention relates to a drilling machine with at least two machining heads for machining printed circuit boards.

BACKGROUND OF THE INVENTION

For machining printed circuit boards, there is an increasing demand for highly flexible, high-precision, high-output machines. For which purpose, drilling machines have been devised comprising a number of machining heads for simultaneously drilling a corresponding number of identical boards. Nevertheless, despite the high output achieved, the degree of flexibility of such machines is invariably poor.

A drilling machine is also known comprising a table movable along the usual Y axis and which may be loaded with a number of boards, even of different sizes; and a number of machining heads movable independently of one another along the usual X axis so as to machine boards of different sizes and/or different hole patterns.

The above machine has several drawbacks. In particular, setting the Y-axis position of the heads on the respective carriages is extremely complicated. Moreover, since the holes in the circuits are normally arranged in a matrix of rows and columns, the various heads can only operate simultaneously at locations along the same rows of the respective circuit boards, i.e. at locations having the same Y-axis coordinate. If any of the boards do not require drilling along a given row, the respective heads must remain idle until all the holes in that particular row have been drilled by the other heads, thus limiting the output of the machine as a whole.

SUMMARY OF THE INVENTION

It is an object of the present invention to provide a highly straightforward, highly flexible drilling machine designed to eliminate the aforementioned drawbacks of known drilling machines.

According to the present invention, there is provided a drilling machine having at least two machining heads for machining printed circuit boards, and comprising a work table movable along a base in a first direction; a cross member fitted to said base; and at least two carriages supporting said two machining heads and sliding along said cross member in a second direction perpendicular to said first direction; characterized in that at least one of said two machining heads is movable, with respect to the corresponding carriage and in said first direction, by actuating means.

BRIEF DESCRIPTION OF THE DRAWINGS

A preferred, non-limiting embodiment of the invention will be described by way of example with reference to the accompanying drawings, in which:

FIG. 1 shows a schematic front view of a drilling machine for drilling printed circuit boards in accordance with the invention;

FIG. 2 shows a top plan view of the FIG. 1 drilling machine;

FIG. 3 shows a larger-scale section along line III—III in FIG. 1;

FIG. 4 shows a partial schematic view of a printed circuit board.

DETAILED DESCRIPTION OF THE INVENTION

Number 5 in FIG. 1 indicates as a whole a drilling machine comprising a base 6 made, for example, of granite and fitted with two lateral uprights 7 in turn fitted with a prismatic cross member 8; and a work table 9 fitted with a number of known supporting pads 11 by which to slide along two bars 12 made of granite and extending in a first direction or along an axis Y (FIG. 2). Table 9 is moved along the Y axis by means of a screw-nut screw pair 14 and a reversible electric motor 13 controlled by a numeric-control unit indicated as a whole by 10, and is fitted with a fixture 15 for receiving and locating a pack of printed circuit boards 16 for drilling.

Drilling machine 5 also comprises two machining heads 17a and 17b (FIG. 1) carried respectively by two carriages 18a and 18b which slide along cross member 8 in a direction perpendicular to the traveling direction of table 9, i.e. along the X axis. Each head 17a, 17b comprises a spindle 19 for activating a tool or drill 20; and a known board-holder device 21. Spindle 19 is movable vertically along the Z axis by a reversible electric motor 22 controlled by numeric-control unit 10.

Carriages 18a and 18b are moved independently of each other along the X axis; for which purpose, drilling machine 5 comprises two screw-nut screw pairs 23a, 23b (FIG. 2), each comprising a screw 24 and a nut screw 25. Each screw 24 rotates on a respective central support 26 and a respective lateral support 27, both fixed to cross member 8; each nut screw 25 is a recirculating-ball type fitted to respective carriage 18a, 18b; and the two screws 24 are aligned with each other and rotated by two reversible electric motors 30 controlled by numeric-control unit 10.

Each carriage 18a, 18b comprises a cast metal structure 28a, 28b surrounding cross member 8; each structure 28a, 28b comprises a vertical front plate 29a, 29b having an inner lateral edge 31 (FIG. 1) and an outer lateral edge 32 defining the overall size of carriage 18a, 18b along the X axis; each structure 28a, 28b is fitted with the usual cursor 33 of a position transducer for feedback control of the corresponding motor 30; and the two cursors 33 cooperate with a scale, e.g. an optical scale, 34.

As is known, printed circuit boards 16 normally require a number of holes 35 (FIG. 4) for the circuit conductors, and which are normally arranged in a matrix of rows and columns. The row pitch P is normally 2.54 mm; and the boards 16 in each pack are connected to one another by two locating pins 40 (only one shown in FIG. 4) which engage fixture 15 (FIG. 2) to hold the pack of boards 16 in a given position on table 9 with the rows of the matrix parallel to the X axis. If table 9 is fitted with two different fixtures 15, two packs of boards 16 requiring holes 35 in different locations in each row may be drilled simultaneously.

Alternatively, table 9 may be fitted with one fixture 15, as in FIG. 2, for supporting a larger single pack of boards 16 in which holes 35 are drilled partly by head 17a and partly by head 17b. For which purpose, carriages 18a and 18b are movable simultaneously towards the center of cross member 8 to bring the two edges 31 substantially into contact with each other and so minimize the distance at which heads 17a and 17b may simultaneously machine the same pack of boards 16.

Moreover, the two nut screws 25 are so located as to enable each carriage 18a, 18b to move respective head 17a, 17b beyond the center line of table 9, as shown by the dotted lines in FIG. 1, so that the two traveling ranges of heads 17a and 17b have an overlapping portion 36 in which both may operate, as described in Patent Application TO97A000596 filed by the present Applicant corresponding to U.S. Pat. No. 5,882,286.

According to the invention, at least one of heads 17a, 17b (FIG. 2) is movable with respect to respective carriage 18a, 18b along the Y axis. More specifically, head 17a is fitted to a fastening plate 37 by which head 17a is fitted to front plate 29a of structure 28a; and head 17b is carried by a slide 38 having two pads 39 (FIGS. 1 and 3) sliding along two prismatic guides 41 parallel to the Y axis. Guides 41 are carried by a vertical longitudinal plate 42 integral with and perpendicular to front plate 29b of structure 28b.

Slide 38 is moved along guides 41 by actuating means comprising a screw 43 rotated by a reversible electric motor 44 controlled by numeric-control unit 10. Motor 44 is carried by longitudinal plate 42 to which screw 43 is mounted for rotation; and screw 43 engages a nut screw 46 fitted to slide 38.

The maximum travel of slide 38 of head 17b along the Y axis is limited, and may equal twice the standard industrial pitch P of the rows in the matrix of holes 35 of printed circuit boards 16. Advantageously, the maximum travel of slide 38 may be about 6 mm, so that head 17b may be positioned over each of the two rows of holes 35 adjacent to the row aligned with head 17a by the movement of table 9.

The movement of slide 38 along the Y axis serves two purposes, the first being to substitute for mechanical adjustment of heads 17a, 17b along the Y axis, to ensure the heads are perfectly aligned along the X axis, i.e. are positioned over the same row in the matrix of holes 35. For which purpose, when setting up drilling machine 5, the difference in the position of heads 17a, 17b along the Y axis, i.e. misalignment of the heads with respect to the X axis, is determined and recorded in numeric-control unit 10 as a correction constant by which to correct the positions of head 17b along the Y axis, and which is used by the computer program controlling unit 10 to correct the position of head 17b.

Secondly, slide 38 is moved along the Y axis to enable both heads to simultaneously machine two adjacent rows in the matrix of holes 35. If, in a given row in the matrix, one of heads 17a, 17b is called upon to drill a different number of holes from the other, both heads 17a, 17b may be operated simultaneously in different rows, thus reducing the downtime of the head 17a, 17b required to drill fewer holes 35, and so greatly increasing the output of drilling machine 5. In such cases, the movement of slide 38 in both directions obviously also takes into account the correction constant of the positions of head 17b along the Y axis.

The advantages, as compared with known machines, of the drilling machine according to the invention will be clear from the foregoing description. In particular, it provides, on the one hand, for faster setting of heads 17a and 17b, and, on the other, for greatly increasing the output of heads 17a, 17b of drilling machine 5.

Clearly, changes may be made to the drilling machine as described herein without, however, departing from the scope of the accompanying claims. For example, drilling machine 5 may have more than two heads; the travel of slide 38 may equal pitch P of the rows in the matrix of holes in boards 16; and, as opposed to numeric control, the slide may be moved by an actuator for moving the slide a fixed distance equal to pitch P.

What is claimed is:

1. A drilling machine having at least two machining heads for machining printed circuit boards, comprising:

a work table movable along a base in a first direction (Y);

a cross member fitted to said base;

at least two carriages supporting said two machining heads, each one of said carriages being slidable along said cross member in a second direction (X) perpendicular to said first direction (Y);

at least two screw-nut screw pairs associated with said at least two carriages, each one of said pairs including a screw-nut secured to the associated carriage and a screw rotatably supported by said cross member parallel to said second direction (X), each one of said screws being rotated by a corresponding reversible electric motor controlled by a numerical control unit;

at least one of said machining heads being movable with respect to the corresponding carriage in said first direction (Y);

a slide fitting said at least one machining he ad;

at least two prismatic guides secured to said corresponding carriage parallel to each other and to said first direction (Y);

at least two pads carried by said slide and slidable on said prismatic guides; and at least a further screw-nut screw pair mounted between said slide and said corresponding carriage and including a further screw parallel to said first direction (Y), said further screw being rotated by a further reversible electric motor operated by said numerical control unit for moving said slide in said first direction (Y).

2. A drilling machine as claimed in claim 1, wherein said boards must be drilled with holes arranged in a matrix of rows and columns; said rows being parallel to said second direction (X); characterized in that said further electric motor is so controlled as to enable said two machining heads to simultaneously drill two different rows of said matrix.

3. A drilling machine as claimed in claim 1, characterized in that said numerical control unit is controlled by a computer program, and in that a constant corresponding to the misalignment of said two machining heads in said second direction (X) is inserted into said program to correct the position of said at least one moveable machining head along said first direction (Y).

4. A drilling machine having at least two machining heads for machining printed circuit boards to be drilled with holes arranged in a matrix of rows and columns, comprising:

a work table movable along a base in a first direction (Y);

a cross member fitted to said base;

at least two carriages supporting said two machining heads and sliding along said cross member in a second direction (X) perpendicular to said first direction (Y);

said rows of said matrix being parallel to said second direction (X);

at least one of said two machining heads being movable with respect to the corresponding carriage in said first direction (Y) by actuating means;

a numeric control unit operating under the control of a computer program for controlling said actuating means as to enable said two machining heads to simultaneously drill holes in two different rows of said matrix, said program being adapted to receive a correction constant corresponding to the misalignment of said two machining heads in said second direction (X) to enable said control unit to control said actuating means and to correct the relative positions of said machining heads along said first direction (Y) in any position of said second direction (X).

5. A drilling machine as claimed in claim 4, characterized in that said movable machining head travels a distance in said first direction (Y) equal to twice the pitch (P) of said rows.

6. A drilling machine as claimed in claim 4, characterized in that said movable machining head is fitted to said corresponding carriage by means of a slide movable in said first direction (Y).

7. A drilling machine as claimed in claim 6, characterized in that said slide has at least two parallel pads sliding along two prismatic guides carried by said corresponding carriage.

8. A drilling machine as claimed in claim 4, characterized in that said actuating means comprise a screw-nut screw pair located between said slide and said corresponding carriage; and a reversible electric motor controlled by said numerical control unit.

\* \* \* \* \*